United States Patent
Zhang et al.

(10) Patent No.: US 10,707,882 B1
(45) Date of Patent: Jul. 7, 2020

(54) VOLTAGE-CONTROLLED OSCILLATOR CIRCUIT AND PHASE-LOCKED LOOP CIRCUIT

(71) Applicant: Shanghai Huali Microelectronics Corporation, Shanghai (CN)

(72) Inventors: Ning Zhang, Shanghai (CN); Zhili Wang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 16/789,550

(22) Filed: Feb. 13, 2020

(30) Foreign Application Priority Data

Aug. 22, 2019 (CN) .......................... 2019 1 0777056

(51) Int. Cl.
*H03L 7/099* (2006.01)
*H03L 7/089* (2006.01)

(52) U.S. Cl.
CPC .......... *H03L 7/0995* (2013.01); *H03L 7/0891* (2013.01)

(58) Field of Classification Search
CPC ............................... H03L 7/099; H03L 7/0995
See application file for complete search history.

(56) References Cited

U.S. PATENT DOCUMENTS

| 7,791,420 | B2* | 9/2010 | Chen | H03L 7/10 331/172 |
| 8,446,139 | B2* | 5/2013 | Tsukuda | H03L 1/00 323/312 |
| 8,519,746 | B2* | 8/2013 | Wang | H03L 7/099 327/103 |

* cited by examiner

*Primary Examiner* — Hai L Nguyen
(74) *Attorney, Agent, or Firm* — Banner & Witcoff, Ltd.

(57) ABSTRACT

The present invention discloses a voltage-controlled oscillator (VCO) circuit, When the VCO circuit works, the DC control voltage is divided into two portions, both of which determine an oscillation frequency of the VCO circuit. One portion of the DC control voltage controls a current provided by the fifth PMOS transistor, and the other portion of the DC control voltage controls the current of the forth PMOS transistor after passing through the third NMOS transistor, thereby controlling oscillation of the VCO circuit. The former plays a leading role when the DC control voltage is relatively low, and the latter plays a leading role when the DC control voltage is relatively high, thereby effectively increasing the use range of the DC control voltage while the high frequency noise interference on the DC control voltage is suppressed. The present invention further discloses a phase-locked loop circuit.

9 Claims, 3 Drawing Sheets

VOLTAGE-CONTROLLED OSCILLATOR CIRCUIT AND PHASE-LOCKED LOOP CIRCUIT

CROSS REFERENCE TO RELATED APPLICATIONS

The present application claims priority to and the benefit of Chinese Patent Application No. 201910777056.0 filed on Aug. 22, 2019, the disclosure of which is incorporated herein by reference in its entirety as part of the present application.

BACKGROUND

The present invention relates to the field of CMOS integrated circuit design, in particular to a voltage-controlled oscillator circuit and a phase-locked loop circuit.

In a phase-locked loop (PLL) design, a voltage-controlled oscillator (VCO) is one of the core modules. Taking a charge pump phase-locked loop (PLL) as an example, during working, a charge pump converts an output of a phase frequency detector into a pulse current, which is converted into a DC control voltage VC that serves as a voltage-controlled signal of the voltage-controlled oscillator after passing though a low pass filter. Therefore, for the voltage-controlled oscillator, the DC control voltage VC serves as an input thereof, a frequency serves as an output thereof, and an oscillation frequency thereof directly determines a frequency range in which the phase-locked loop PLL can work.

A ring oscillator consisting of multistage single-ended or differential inverters is a main common voltage-controlled oscillator, wherein an equivalent resistance or equivalent capacitance of output end of the inverter is changed by DC control voltage VC, so as to change an oscillation frequency of the ring oscillator.

A common voltage-controlled oscillator is shown in FIG. 1, which is a ring oscillator consisting of an odd number of inverters, wherein the ring oscillator is driven by a PMOS transistor controlled by a DC control voltage VC output by a filter. Different DC control voltage VC corresponding to different current capacities provided by the PMOS transistor for the ring oscillator, and thus different oscillation frequencies are output.

For the ring oscillator of such the structure, the DC control voltage VC is used in a range of 0V to VDD-Vgs, wherein VDD is the power supply at the source of the PMOS transistor, and Vgs is a gate-source voltage drop of the PMOS transistor. However, due to the effect of a process corner, etc., when SS corner and FF corner conditions are covered, the use range of the DC control voltage VC may be reduced dramatically. In the same working frequency range of the voltage-controlled oscillator, when the use range of the DC control voltage VC is larger, a gain of the voltage-controlled oscillator is smaller, causing a smaller jitter. Therefore, in order to reduce clock noise, it is necessary to increase the use range of the DC control voltage VC.

BRIEF SUMMARY OF THE INVENTION

The technical issue to be settled by the present invention is how to effectively increase the use range of a DC control voltage of a voltage-controlled oscillator circuit while high frequency noise interference on the DC control voltage is suppressed.

To settle the above technical issue, the present invention provides a voltage-controlled oscillator circuit, comprising: a voltage conversion circuit, a ring oscillator, and a fourth PMOS transistor PM4, and a fifth PMOS transistor PM5, wherein:

the voltage conversion circuit comprises a current source I0, a first PMOS transistor PM1, a second PMOS transistor PM2, a third PMOS transistor PM3, a first NMOS transistor NM1, a second NMOS transistor NM 2, and a third NMOS transistor NM3;

a drain terminal and a gate terminal of the first PMOS transistor PM1 and gate terminals of the second PMOS transistor PM2 and the third PMOS transistor PM3 are connected to the current source I0;

source terminals of the first PMOS transistor PM1, the second PMOS transistor PM2, and the third PMOS transistor PM3 are connected to a working voltage VDD;

a drain terminal and a gate terminal of the first NMOS transistor NM1 and a gate terminal of the second NMOS transistor NM2 are connected to a drain terminal of the second PMOS transistor PM2;

source terminals of the first NMOS transistor NM1 and the second NMOS transistor NM2 are grounded;

a drain terminal of the second NMOS transistor NM2 and a source terminal of the third NMOS transistor NM3 are connected to an output end of the voltage conversion circuit;

a drain terminal of the third NMOS transistor NM3 is connected to a drain terminal of the third PMOS transistor PM3;

source terminals of the fourth PMOS transistor PM4 and the fifth PMOS transistor PM5 are connected to the working voltage VDD;

drain terminals of the fourth PMOS transistor PM4 and the fifth PMOS transistor PM5 are connected to a control end of the ring oscillator;

a gate terminal of the fourth PMOS transistor PM4 is connected to the output end of the voltage conversion circuit; and a gate terminal of the third NMOS transistor NM3 and a gate terminal of the fifth PMOS transistor PM5 are connected to a DC control voltage VC.

Preferably, the ring oscillator comprises an odd number of inverters, and inputs and outputs of the odd number of inverters are sequentially connected to each other to form a ring; and control ends of the odd number of inverters are connected together as the control end of the ring oscillator.

Preferably, the ratio between the width to length ratios of the fourth PMOS transistor PM4 and the fifth PMOS transistor PM5 is 1/6 to 1/2.

Preferably, the ratio between the width to length ratios of the fourth PMOS transistor PM4 and the fifth PMOS transistor PM5 is 1/6, 1/5, 1/4, 1/3, or 1/2.

Preferably, the ratio between the width to length ratios of the first PMOS transistor PM1 and the third PMOS transistor PM3 is 1 to 3.

Preferably, the ratio between the width to length ratios of the first PMOS transistor PM1 and the third PMOS transistor PM3 is 1, 2, or 3.

In order to settle the above technical issue, the present invention provides a phase-locked loop circuit comprising the above voltage-controlled oscillator circuit, further comprising: a phase frequency detector (PFD), a charge pump (CP), and a low pass filter (LPF), wherein:

an output of the phase frequency detector (PFD) is connected to an input of the charge pump (CP);

an output of the charge pump (CP) is connected to an input of the low pass filter (LPF);

the low pass filter (LPF) outputs a DC control voltage VC to the voltage-controlled oscillator circuit (VCO);

an output of the voltage-controlled oscillator circuit (VCO) is fed back to a second input end of the phase frequency detector (PFD) after being subject to frequency division; and a first input end of the phase frequency detector (PFD) is connected to a reference clock signal.

Preferably, the reference clock signal is connected to the first input end of the phase frequency detector (PFD) after being subject to frequency division.

Preferably, the output of the voltage-controlled oscillator circuit (VCO) serves as an output of the phase-locked loop circuit after being subject to frequency division.

In the voltage-controlled oscillator circuit of the present invention, the ring oscillator circuit is driven by two control branches, thereby effectively increasing the use range of the DC control voltage VC while the high frequency noise interference on the DC control voltage VC is suppressed.

BRIEF DESCRIPTION OF THE DRAWINGS

In order to more clearly describe the technical solutions of the present invention, the drawings required by the present invention will be briefly described below. It is obvious that the drawings in the following description are merely some embodiments of the present invention, and those skilled in the art can obtain other drawings based on these drawings without any creative work.

DETAILED DESCRIPTION OF THE INVENTION

The technical solutions of the present invention are clearly and completely described below with reference to the drawings. It is obvious that the described embodiments are merely some of the embodiments of the present invention, rather than all of the embodiments. All other embodiments obtained by those skilled in the art based on the embodiments of the present invention without creative work fall within the protection scope of the present invention.

Embodiment 1

Figure 1:
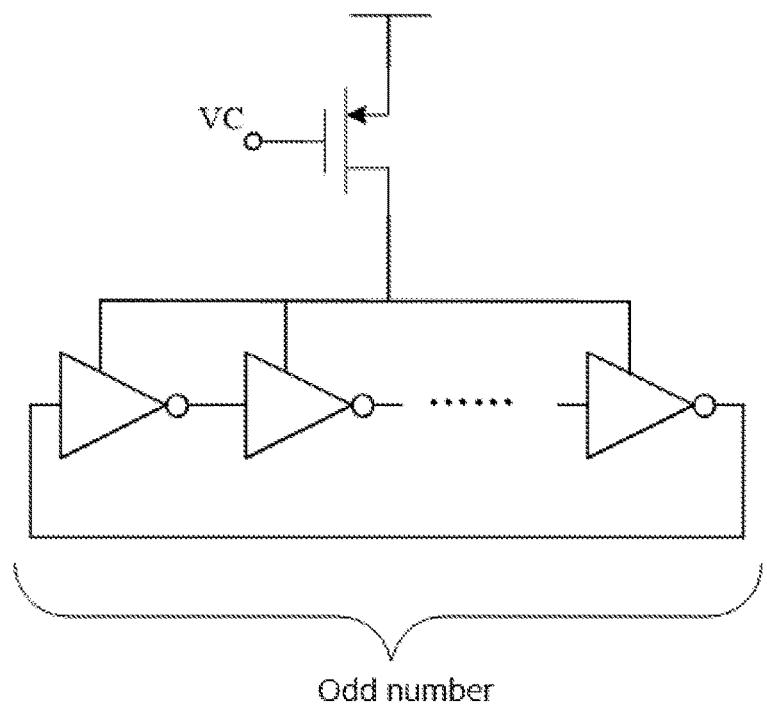
FIG. 1 is a circuit diagram of a common voltage-controlled oscillator.
Figure 2:
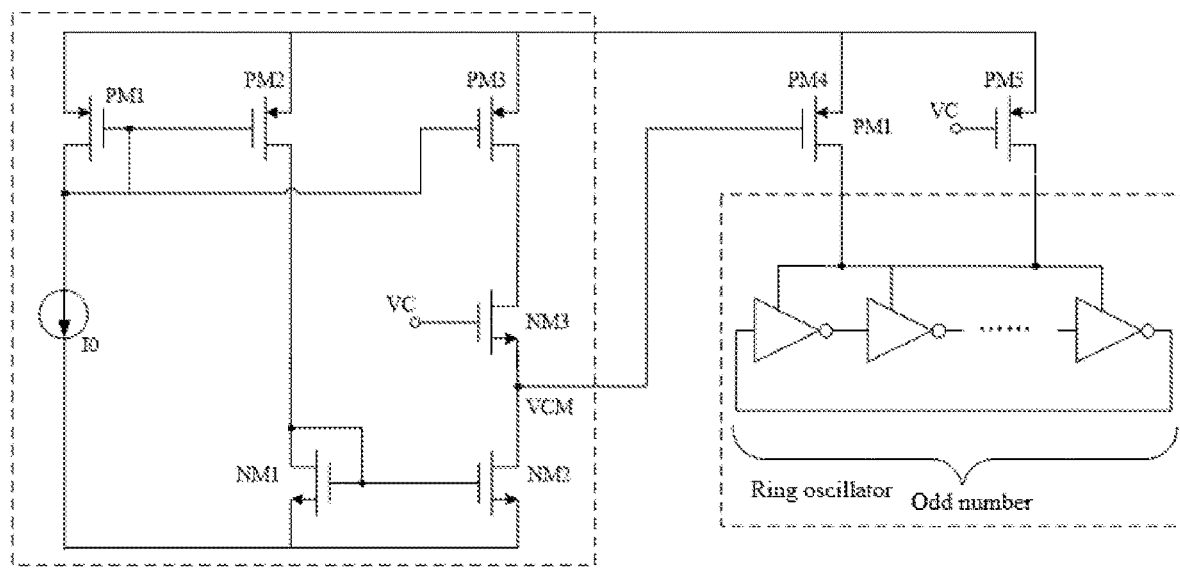
FIG. 2 is a circuit diagram in an embodiment of a voltage-controlled oscillator circuit of the present invention.

As shown in FIG. 2, a voltage-controlled oscillator circuit comprises a voltage conversion circuit, a ring oscillator, and a fourth PMOS transistor PM4, and a fifth PMOS transistor PM5.

The voltage conversion circuit comprises a current source I0, a first PMOS transistor PM1, a second PMOS transistor PM2, a third PMOS transistor PM3, a first NMOS transistor NM1, a second NMOS transistor NM2, and a third NMOS transistor NM3.

A drain terminal and a gate terminal of the first PMOS transistor PM1 and gate terminals of the second PMOS transistor PM2 and the third PMOS transistor PM3 are connected to the current source I0.

Source terminals of the first PMOS transistor PM1, the second PMOS transistor PM2, and the third PMOS transistor PM3 are connected to a working voltage VDD.

A drain terminal and a gate terminal of the first NMOS transistor NM1 and a gate terminal of the second NMOS transistor NM2 are connected to a drain terminal of the second PMOS transistor PM2.

Source terminals of the first NMOS transistor NM1 and the second NMOS transistor NM2 are grounded.

A drain terminal of the second NMOS transistor NM2 and a source terminal of the third NMOS transistor NM3 are connected to an output end of the voltage conversion circuit.

A drain terminal of the third NMOS transistor NM3 is connected to a drain terminal of the third PMOS transistor PM3.

Source terminals of the fourth PMOS transistor PM4 and the fifth PMOS transistor PM5 are connected to the working voltage VDD.

Drain terminals of the fourth PMOS transistor PM4 and the fifth PMOS transistor PM5 are connected to a control end of the ring oscillator.

A gate terminal of the fourth PMOS transistor PM4 is connected to the output end of the voltage conversion circuit.

A gate terminal of the third NMOS transistor NM3 and a gate terminal of the fifth PMOS transistor PM5 are connected to a DC control voltage VC.

In the voltage-controlled oscillator circuit of embodiment 1, the first PMOS transistor PM1, the second PMOS transistor PM2, and the third PMOS transistor PM3 constitute a PMOS current mirror, the first NMOS transistor NM1 and the second NMOS transistor NM2 constitute an NMOS current mirror, and the third NMOS transistor NM3 serves as a source voltage follower. When the voltage-controlled oscillator circuit works, the DC control voltage VC is divided into two portions, both of which determine an oscillation frequency of the voltage-controlled oscillator circuit. One portion of the DC control voltage VC controls a current provided by the fifth PMOS transistor PM5, and the other portion of the DC control voltage VC is converted into an output end voltage VCM of the voltage conversion circuit after passing through the third NMOS transistor NM3, so as to control the current of the forth PMOS transistor PM4, thereby controlling oscillation of the voltage-controlled oscillator circuit, wherein VCM=VC-Vgsn, and Vgsn is a gate-source voltage drop of the third NMOS transistor. The former plays a leading role when the DC control voltage VC is relatively low, and the latter plays a leading role when the DC control voltage VC is relatively high, thereby effectively increasing the use range of the DC control voltage VC in the voltage-controlled oscillator circuit.

In the voltage-controlled oscillator circuit of embodiment 1, the ring oscillator circuit is driven by two control branches, thereby effectively increasing the use range of the DC control voltage VC while the high frequency noise interference on the DC control voltage VC is suppressed.

Embodiment 2

In the voltage-controlled oscillator circuit of embodiment 1, the ring oscillator comprises an odd number of inverters, and inputs and outputs of the odd number of inverters are sequentially connected to each other to form a ring.

Control ends of the odd number of inverters are connected together as the control end of the ring oscillator.

Preferably, the ratio between the width to length ratios of the fourth PMOS transistor PM4 and the fifth PMOS transistor PM5 is 1/6 to 1/2. For example, the ratio between the width to length ratios of the fourth PMOS transistor PM4 and the fifth PMOS transistor PM5 can be 1/6, 1/5, 1/4, 1/3, or 1/2. The fourth PMOS transistor PM4 and the fifth PMOS transistor PM5 can better cohere with each other by appropriately adjusting the ratio between the width to length ratios of the fourth PMOS transistor PM4 and the fifth PMOS transistor PM5.

Preferably, the ratio between the width to length ratios of the first PMOS transistor PM1 and the third PMOS transistor PM3 is 1 to 3. For example, the ratio between the width to length ratios of the first PMOS transistor PM1 and the third PMOS transistor PM3 can be 1, 2, or 3.

For a current-driven ring oscillator, an oscillation frequency $f=\alpha I/CV$, wherein $\alpha$ is a proportional coefficient, I is a drive current, C is an equivalent capacitance of an output end of an inverter, and V is an output amplitude of the inverter. Therefore, it can be seen that the oscillation frequency is directly proportional to the drive current, so when a frequency requirement is given, ranges of a current and a DC control voltage are determined. In general, with the increase of the DC control voltage VC, the current used for driving the ring oscillator gradually decreases, and the oscillation frequency thus decreases. In a design, from the perspective of a process corner, in the same DC control voltage VC condition, a frequency in the SS corner is lowest and a frequency in the FF corner highest. Specifically, when the DC control voltage VC is much less than a threshold voltage Vthn of the third NMOS transistor NM3, the third NMOS transistor NM3 is in a cut-off region, and the output end voltage VCM of the voltage conversion circuit is a fixed voltage, so that the voltage-controlled transistor, namely the fourth PMOS transistor PM4, has a relatively small control current, in which case the voltage conversion circuit basically does not work and the drive current of the ring oscillator is mainly generated by the fifth PMOS transistor PM5 controlled by the DC control voltage VC. In this case, the voltage-controlled oscillator works at a relatively high frequency in the TT corner, and correspondingly, the design mainly needs to satisfy use in the SS corner. With the increase of the DC control voltage VC, a current passing through the fifth PMOS transistor PM5 gradually decreases, when the DC control voltage VC is increased to VDD-Vthp (a threshold voltage of the fifth PMOS transistor PM5), the current passing through the fifth PMOS transistor PM5 is very small, and during this process, use in the TT corner is mainly considered in the design. However, with the increase of the DC control voltage VC, the current passing through the fifth PMOS transistor PM5 gradually decreases to 0, when the DC control voltage VC is greater than Vthn, the voltage conversion circuit starts to work, and VCM=VC-Vthn controls the fourth PMOS transistor PM4 to drive the ring oscillator, in which case use in the FF corner is mainly considered.

Figure 3:
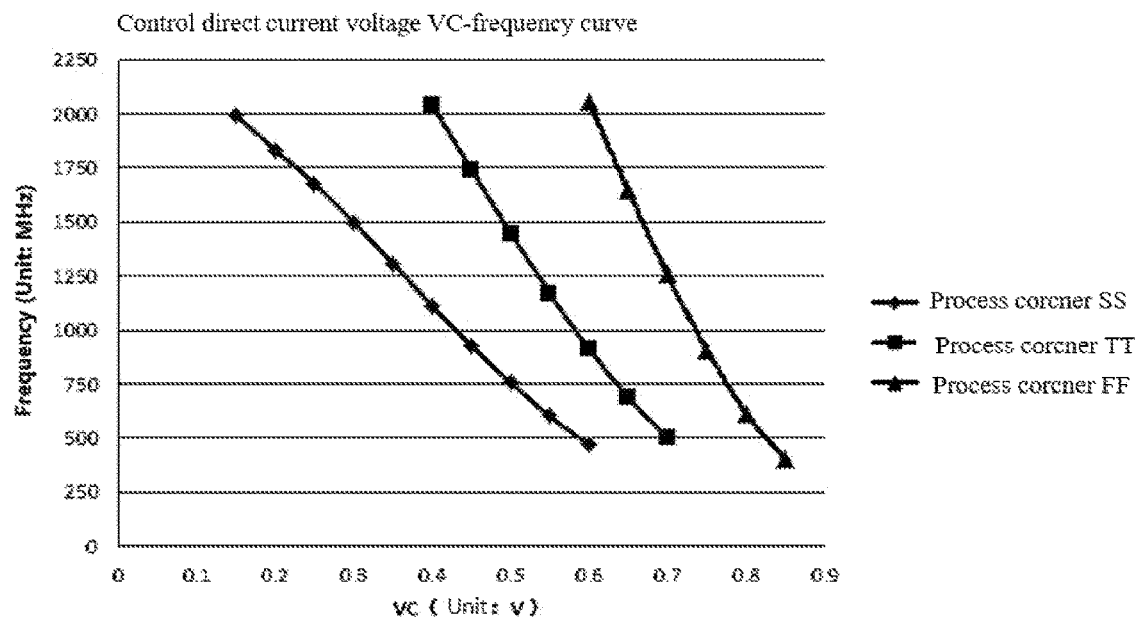
FIG. 3 is a DC control voltage-frequency curve of a common voltage-controlled oscillator circuit.
Figure 4:
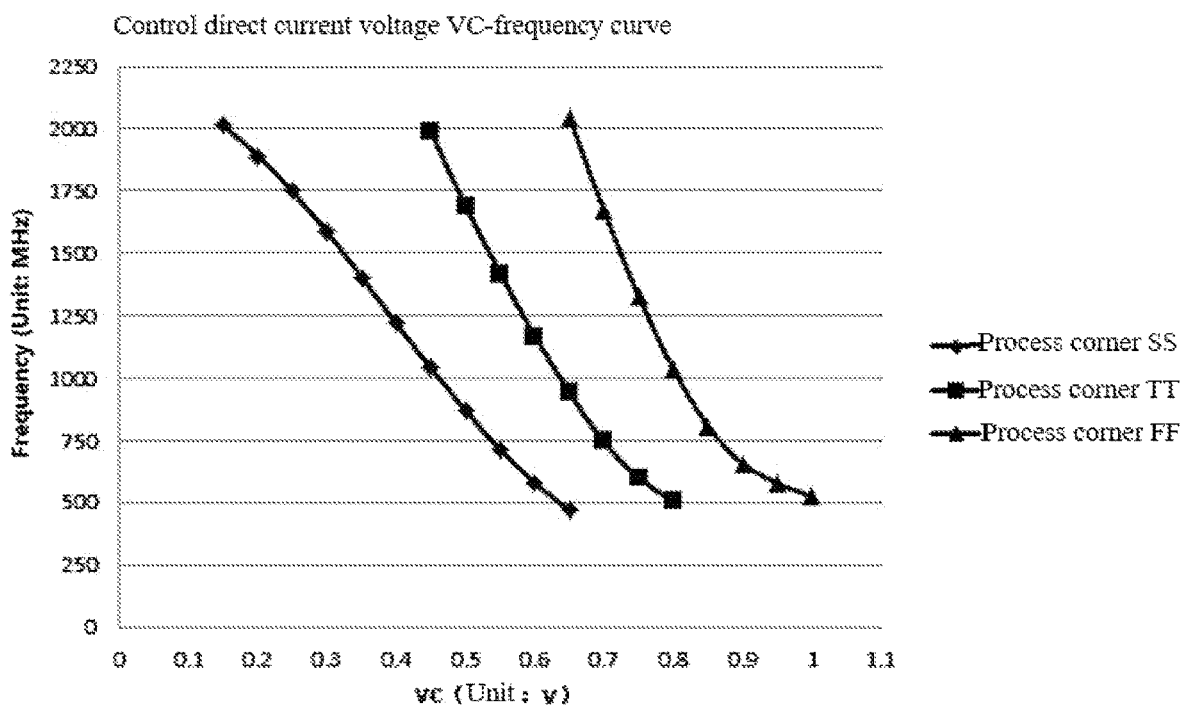
FIG. 4 is a DC control voltage-frequency curve in an embodiment of a voltage-controlled oscillator circuit of the present invention.

The voltage-controlled oscillator circuit of embodiment 2 can work at a frequency range of 500 MHz-2000 MHz. A simulation curve of the current-driven ring oscillator is shown in FIG. 3, and a simulation curve of the voltage-controlled oscillator circuit comprising the voltage conversion circuit is shown in FIG. 4. By comparing FIG. 3 with FIG. 4, it can be seen that:

for the SS corner, the DC control voltage VC is relatively small, and the voltage conversion circuit does not work, so the curve is basically not affected;

for the TT corner, the use range of the DC control voltage VC changed from 400 mV~700 mV to 450 mV~800 mV, the range being increased by 17%; and for the FF corner, the use range of the DC control voltage VC is changed from 600 mV~850 mV to 650 mV~1000 mV, the range being increased by 60%, and the use range of the DC control voltage VC being significantly increased.

Embodiment 3

Figure 5:
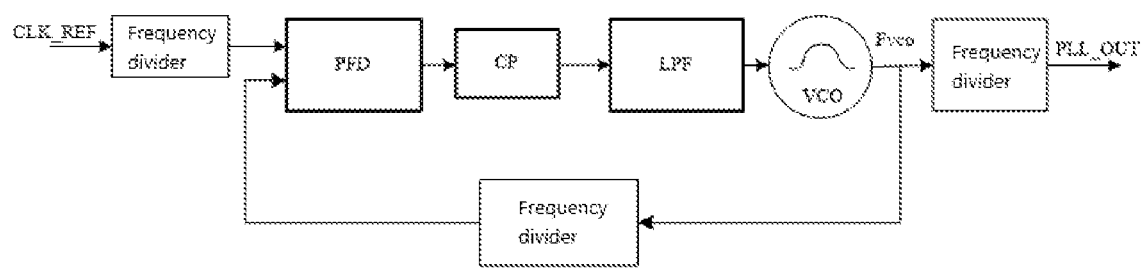
FIG. 5 is a structural block diagram in an embodiment of a phase-locked loop circuit of the present invention.

A phase-locked loop (PLL) circuit comprising the voltage-controlled oscillator circuit (VCO) of embodiment 1 or 2 is shown in FIG. 5 and further comprises: a phase frequency detector (PFD), a charge pump (CP), and a low pass filter (LPF).

An output of the phase frequency detector (PFD) is connected to an input of the charge pump (CP);

An output of the charge pump (CP) is connected to an input of the low pass filter (LPF).

The low pass filter LPF outputs a DC control voltage VC to the voltage-controlled oscillator circuit (VCO).

An output of the voltage-controlled oscillator circuit (VCO) is fed back to a second input end of the phase frequency detector (PFD) after being subject to frequency division.

A first input end of the phase frequency detector (PFD) is connected to a reference clock signal CLK_REF.

Preferably, the reference clock signal CLK_REF is connected to the first input end of the phase frequency detector (PFD) after being subject to frequency division.

Preferably, the output of the voltage-controlled oscillator circuit (VCO) serves as an output of the phase-locked loop (PLL) circuit after being subject to frequency division.

In the phase-locked loop (PLL) circuit of embodiment 3, when the circuit works, the low pass filter (LPF) transfers the DC control voltage VC obtained after filtering to the voltage-controlled oscillator circuit (VCO).

The above are merely preferred embodiments of the present application and are not intended to limit the present application. Various changes and modifications can be made to the present application by those skilled in the art. Any modifications, equivalent substitutions, improvements, etc. made within the spirit and principle of the present application shall fall within the protection scope of the present application.

What is claimed is:

1. A voltage-controlled oscillator circuit, comprising: a voltage conversion circuit, a ring oscillator, and a fourth PMOS transistor, and a fifth PMOS transistor, wherein:
the voltage conversion circuit comprises a current source, a first PMOS transistor, a second PMOS transistor, a third PMOS transistor, a first NMOS transistor, a second NMOS transistor, and a third NMOS transistor;
a drain terminal and a gate terminal of the first PMOS transistor and gate terminals of the second PMOS transistor and the third PMOS transistor are connected to the current source;
source terminals of the first PMOS transistor, the second PMOS transistor, and the third PMOS transistor are connected to a working voltage;
a drain terminal and a gate terminal of the first NMOS transistor and a gate terminal of the second NMOS transistor are connected to a drain terminal of the second PMOS transistor;

source terminals of the first NMOS transistor and the second NMOS transistor are grounded;

a drain terminal of the second NMOS transistor and a source terminal of the third NMOS transistor are connected to an output end of the voltage conversion circuit;

a drain terminal of the third NMOS transistor is connected to a drain terminal of the third PMOS transistor;

source terminals of the fourth PMOS transistor and the fifth PMOS transistor are connected to the working voltage;

drain terminals of the fourth PMOS transistor and the fifth PMOS transistor are connected to a control end of the ring oscillator;

a gate terminal of the fourth PMOS transistor is connected to the output end of the voltage conversion circuit; and a gate terminal of the third NMOS transistor and a gate terminal of the fifth PMOS transistor are connected to a DC control voltage.

2. The voltage-controlled oscillator circuit according to claim 1, wherein:

the ring oscillator comprises an odd number of inverters, and inputs and outputs of the odd number of inverters are sequentially connected to each other to form a ring; and control ends of the odd number of inverters are connected together as the control end of the ring oscillator.

3. The voltage-controlled oscillator circuit according to claim 1, wherein:

the ratio between the width to length ratios of the fourth PMOS transistor and the fifth PMOS transistor is 1/6 to 1/2.

4. The voltage-controlled oscillator circuit according to claim 1, wherein:

the ratio between the width to length ratios of the fourth PMOS transistor and the fifth PMOS transistor is 1/6, 1/5, 1/4, 1/3, or 1/2.

5. The voltage-controlled oscillator circuit according to claim 1, wherein:

the ratio between the width to length ratios of the first PMOS transistor and the third PMOS transistor is 1 to 3.

6. The voltage-controlled oscillator circuit according to claim 1, wherein:

the ratio between the width to length ratios of the first PMOS transistor and the third PMOS transistor is 1, 2, or 3.

7. A phase-locked loop circuit comprising the voltage-controlled oscillator circuit according to claim 1, further comprising: a phase frequency detector, a charge pump, and a low pass filter, wherein:

an output of the phase frequency detector is connected to an input of the charge pump;

an output of the charge pump is connected to an input of the low pass filter;

the low pass filter outputs a DC control voltage to the voltage-controlled oscillator circuit;

an output of the voltage-controlled oscillator circuit is fed back to a second input end of the phase frequency detector after being subject to frequency division; and a first input end of the phase frequency detector is connected to a reference clock signal.

8. The phase-locked loop circuit according to claim 7, wherein:

the reference clock signal is connected to the first input end of the phase frequency detector after being subject to frequency division.

9. The phase-locked loop circuit according to claim 7, wherein:

the output of the voltage-controlled oscillator circuit serves as an output of the phase-locked loop circuit after being subject to frequency division.

* * * * *